United States Patent
Ren et al.

(10) Patent No.: US 10,014,144 B2
(45) Date of Patent: Jul. 3, 2018

(54) CURING METHOD, MANUFACTURE METHOD OF DISPLAY PANEL, DISPLAY PANEL AND MASK

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinyu Ren, Beijing (CN); Bo Zhou, Beijing (CN); Changjian Xu, Beijing (CN); Guojing Ma, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/534,593

(22) PCT Filed: Apr. 28, 2016

(86) PCT No.: PCT/CN2016/080463
§ 371 (c)(1),
(2) Date: Jun. 9, 2017

(87) PCT Pub. No.: WO2017/140030
PCT Pub. Date: Aug. 24, 2017

(65) Prior Publication Data
US 2018/0053619 A1    Feb. 22, 2018

(30) Foreign Application Priority Data

Feb. 19, 2016  (CN) .......................... 2016 1 0092382

(51) Int. Cl.
*G03F 1/00* (2012.01)
*G02F 1/1339* (2006.01)
(Continued)

(52) U.S. Cl.
CPC ............ *H01J 11/12* (2013.01); *G02F 1/1303* (2013.01); *G02F 1/1333* (2013.01);
(Continued)

(58) Field of Classification Search
CPC ..... G03F 1/00; G03F 1/38; G03F 1/50; G03F 1/54; B05D 3/06; B05D 3/067; G02F 1/1339; G02F 1/1303
(Continued)

(56) References Cited

U.S. PATENT DOCUMENTS

2006/0264016 A1* 11/2006 Hyde .................... B82Y 10/00
                                                    438/542
2015/0182321 A1*  7/2015 Karazivan ............ A61C 19/003
                                                    433/3
2016/0370611 A1* 12/2016 Jiang .................... G02F 1/1303

FOREIGN PATENT DOCUMENTS

AU    2002229849 A1    7/2002
CN    104880864 A      9/2015
(Continued)

OTHER PUBLICATIONS

International Search Report to corresponding PCT application No. PCT/CN2016/080463,dated Nov. 11, 2016.
(Continued)

*Primary Examiner* — John A McPherson
(74) *Attorney, Agent, or Firm* — Calfee, Halter & Griswold LLP

(57) ABSTRACT

A curing method, a manufacture method of a display panel, a display panel and a mask, the curing method includes: providing curable material, providing a mask; and providing an incident light on a side of the mask to cure the curable material, wherein a shielding layer of the mask aligns with the curable material; the shielding layer including light conversion material, and the light conversion material is
(Continued)

configured to convert the incident light to an exiting light which is capable of curing the curable material.

15 Claims, 2 Drawing Sheets

(51) Int. Cl.
    *H01J 11/12*     (2012.01)
    *G02F 1/1333*     (2006.01)
    *H01J 11/38*     (2012.01)
    *G02F 1/13*     (2006.01)
    *H01J 9/24*     (2006.01)
    *G03F 1/50*     (2012.01)
    *G03F 1/54*     (2012.01)

(52) U.S. Cl.
    CPC .............. *G02F 1/1339* (2013.01); *G03F 1/00* (2013.01); *G03F 1/50* (2013.01); *G03F 1/54* (2013.01); *H01J 9/242* (2013.01); *H01J 11/38* (2013.01)

(58) Field of Classification Search
    USPC ...... 430/5, 139, 320, 321; 250/458.1, 459.1, 250/467.1, 483; 359/153
    See application file for complete search history.

(56) References Cited

FOREIGN PATENT DOCUMENTS

| | | |
|---|---|---|
| CN | 105116629 A | 12/2015 |
| FR | 2819628 A1 | 7/2002 |

OTHER PUBLICATIONS

First Office Action for Chinese Patent Application No. 201610092382.4 dated Nov. 16, 2017.

\* cited by examiner

US 10,014,144 B2

CURING METHOD, MANUFACTURE METHOD OF DISPLAY PANEL, DISPLAY PANEL AND MASK

CROSS-REFERENCE TO RELATED APPLICATIONS

The present application is based on International Application No. PCT/CN2016/080463, filed on Apr. 28, 2016, which is based upon and claims priority to Chinese Patent Application No. 201610092382.4, filed on Feb. 19, 2016, and the entire contents thereof are incorporated herein by reference.

TECHNICAL FIELD

The present disclosure relates to the field of display technology, and more particularly, to a curing method, a manufacture method of a display panel, a display panel and a mask.

BACKGROUND

In the related art, a display panel is generally cured by a hybrid curing method of an ultraviolet (UV) light curing method and a conventional thermal curing method. UV curing adhesive is characterized in that it may be quickly harden in a short time under appropriate power of ultraviolet light irradiation. However, the UV curing adhesive cannot be thoroughly cured in some regions such as regions shielded from electrode traces. Therefore, a thermal curing method is also needed.

An existing sealing adhesive pre-curing (UV light curing) process uses a glass substrate with a metal pattern as a mask. The mask shields the part which does not need to be pre-cured, and the part which needs to be cured is exposed to the UV light to be pre-cured. Thus, different products require fabrication of different glass substrates as UV masks.

It should be noted that, information disclosed in the above background portion is provided only for better understanding of the background of the present disclosure, and thus it may contain information that does not form the prior art known by those ordinary skilled in the art.

SUMMARY

Embodiments of the present disclosure provide a curing method, a manufacture method of a display panel, a display panel and a mask, which is capable of solving the problem in the related art that a large amount of glass substrates are needed, the manufacture cost is high, and storing and retrieving is inconvenient.

One objective of the present disclosure is to provide a curing method.

According to one aspect of the present disclosure, there is provided a curing method, including providing a mask on curable material and providing an incident light on a side of the mask to cure the curable material, wherein a shielding layer of the mask aligns with the curable material;

the shielding layer includes light conversion material; and the light conversion material is configured to convert the incident light to an exiting light which is capable of curing the curable material.

Another objective of the present disclosure is to provide a manufacture method of a display panel.

According to a second aspect of the present disclosure, there is provided a manufacture method of a display panel, wherein the method includes the above curing method.

Another objective of the present disclosure is to provide a display panel.

According to a third aspect of the present disclosure, there is provided a display panel, wherein the display panel is manufactured through the above manufacture method of a display panel.

Yet another objective of the present disclosure is to provide a mask.

According to a fourth aspect of the present disclosure, there is provided a mask, including a substrate and a shielding layer on the substrate, the shielding layer including light conversion material, wherein the light conversion material is configured to convert an incident light to an exiting light which is capable of curing the curable material.

BRIEF DESCRIPTION OF THE DRAWINGS

In order to more clearly illustrate the technical solutions in embodiments of the present disclosure, the following drawings of the embodiments will be briefly introduced below. Apparently, the drawings in the following description are only for some embodiments of the disclosure, rather than limitations to the present disclosure, wherein.

DETAILED DESCRIPTION

Figure 1:
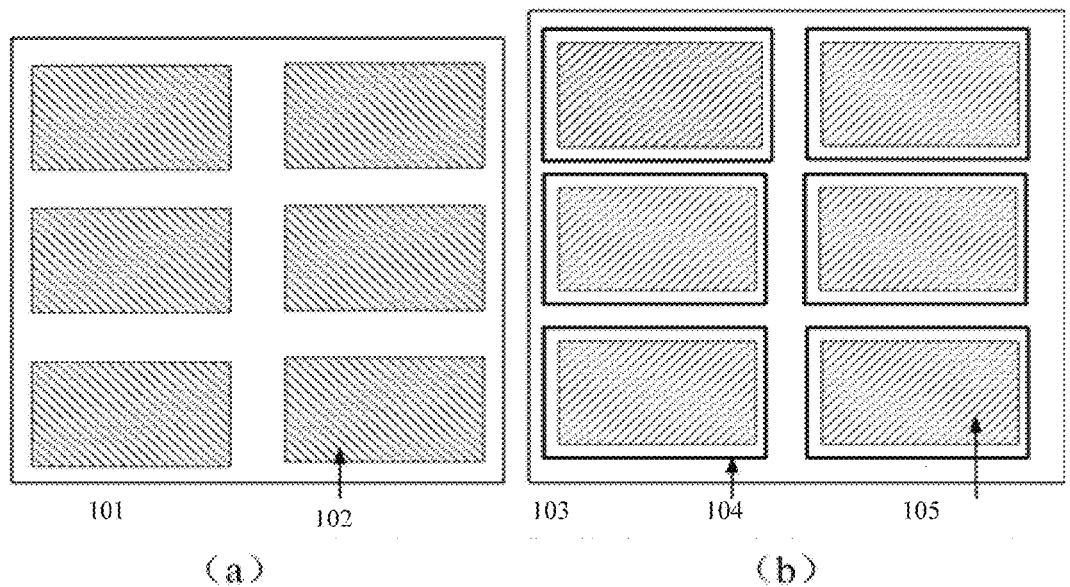
FIG. 1 is a schematic diagram of a UV mask design in the related art.

In order to make the objective, technical solutions and advantages of the embodiments of the present disclosure to be more apparent, the technical solutions in the embodiments of the present disclosure will be clearly and thoroughly described in combination with the drawings. Apparently, the described embodiments are merely part of the embodiments and not all of the embodiments of the present disclosure. Based on the embodiments of the present disclosure, all other embodiments obtained by those of ordinary skill in the art without making creative effort are within the protection scope of the present disclosure.

When referring to the elements of the present disclosure and the embodiments, the articles "a", "a", "the" and "the said" are intended to mean the presence of one or more elements. The terms "include", "include", "contain" and "have" are intended to be inclusive and to indicate that there may be additional elements other than the listed elements. For the purpose of the description below, as the indicated direction shown in the drawings, the terms "up", "down", "left", "right", "vertical", "horizontal", "top", "bottom" and their derivatives are involved in the present disclosure. The terms "overriding", "on top of", "positioned over" or "positioned on top of" means that a first element such as a first structure exists on a second element such as a second structure. However, there may be an intermediate element such as an interface structure between the first element and the second element.

FIG. 1 is a schematic diagram of a UV mask design in the related art. As shown in FIG. 1(*a*), for a UV mask 101, light shielding metal 102 is coated in hatched regions including diagonal of the substrate. FIG. 1(*b*) shows a glass substrate 103 having a liquid crystal display region 105 and sealing adhesive 104. The light shielding metal shields 102 the part which does not need to be cured, such that the part which needs to be cured can be exposed to UV light to be pre-cured. As a UV light damages liquid crystal molecules, thus the liquid crystal display region is required to be shielded during the curing process. Since for different products, the display regions required to be shielded are different, different glass substrates as UV masks need to be fabricated.

Figure 2:
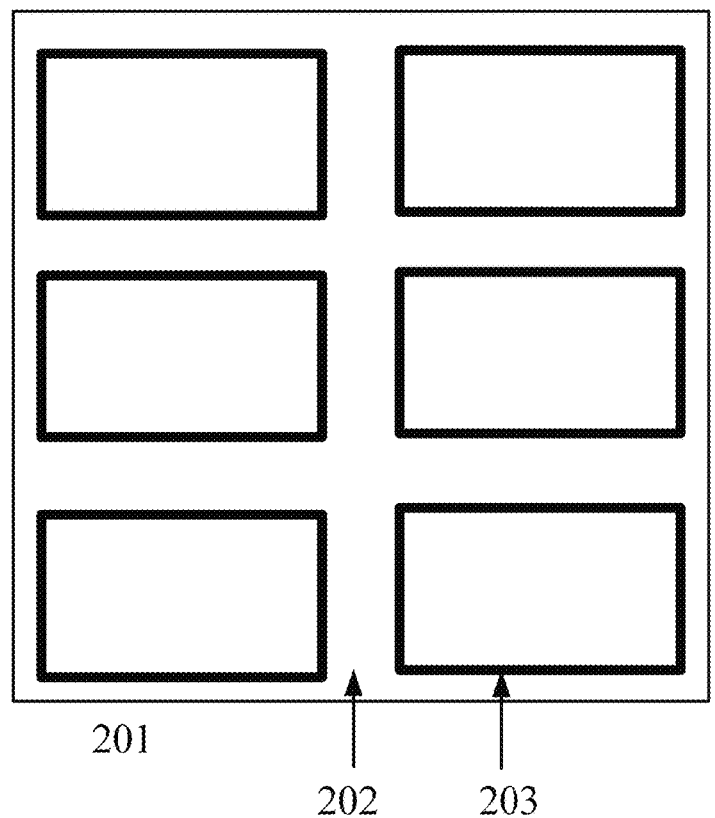
FIG. 2 is a schematic diagram of a mask according to an embodiment of the present disclosure.

FIG. 2 is a schematic diagram of a mask according to an embodiment of the present disclosure. As shown in FIG. 2, the mask 201 has a substrate 202 and a shielding layer 203. The shielding layer 203 includes light conversion material. The light conversion material may convert an incident light into an exiting light which is capable of curing the curable material.

The shape of the pattern on the mask 201 is not limited to be rectangle as shown in FIG. 2, and may be any desired shape. The number of the patterns on the mask 201 is not limited to 6 as shown in FIG. 2, and may be any desired number. In addition, the width and size of the frame of each pattern may be set according to practical needs.

The substrate 202 may include any substrate in the related art, and preferably may be a transparent substrate. The substrate may include at least one of the following materials: glass, PMMA, PET and PC.

The curable material may be any curable material in the related art, including but not limited to UV curing adhesive. In one embodiment, the curable material includes a sealing adhesive.

It should be readily apparent that when a curing process is performed with the mask of the present embodiment, the shielding layer of the mask requires to be aligned with the curable material. That is, the position and pattern of the shielding layer 203 requires to be corresponding to the position and pattern of the curable material to be cured.

In an implementation, the light conversion material includes upper conversion material. Preferably, the upper conversion material includes visible-UV light conversion material for converting a visible light into an ultraviolet light. Hereinafter an example in which the light conversion material is visible-UV light conversion material will be illustrated. It should be noted that, the light conversion material is not limited to include visible-UV light conversion material, and may also include any other light conversion material which is suitable for curing.

For a liquid crystal panel, in one implementation, since a visible light may be used as an incident light. Unlike the ultraviolet light, the incident light does not damage liquid crystal molecules. In the mask, the region corresponding to the display region needs not to be shielded, and only the region corresponding to the sealing adhesive is provided with a shielding layer of visible-UV light conversion material.

The light conversion material may include at least one of the following materials: $NaYF_4:Er^{3+}$, $Yb^{3+}$; $CaF_2(Er^{3+})$; $ZrO_2(Er^{3+})$; $Ca_3(PO_4)_2:Tm^{3+}$. Preferably, the light conversion material may absorb a blue light with a wavelength of about 480 nm, and emit an ultraviolet light of with a wavelength of about 332 nm or 376 nm.

The shielding layer 203 may also further include an adhesive. Preferably, materials with the following properties may be used as the adhesive: high light transmittance, stable nature, without decomposition or polymerization subject to visible light and ultraviolet light and easy to be cleaned. The adhesive may include any suitable colloidal resin. For example, thermal curing epoxy resins can be used as the adhesive.

When the shielding layer 203 also includes an adhesive, in one embodiment, forming a mask also includes: providing a substrate, mixing the adhesive and the light conversion material to form a mixture; and coating the mixture on the substrate as a particular pattern to form a shielding layer.

Figure 3:
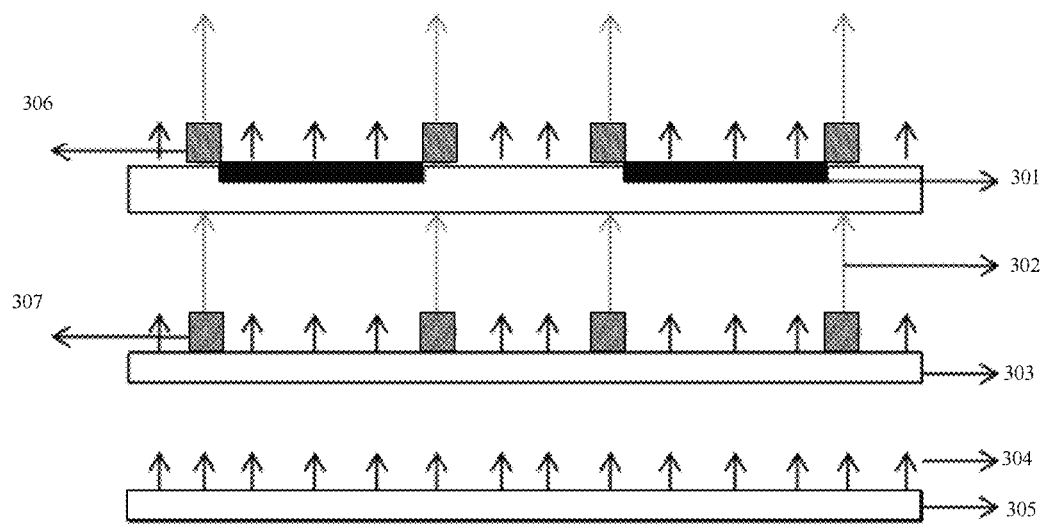
FIG. 3 is a side view of a curing scheme according to an embodiment of the present disclosure.

FIG. 3 is a side view of a curing scheme according to an embodiment of the present disclosure. The curing method as shown in FIG. 3 uses the mask as shown in FIG. 2. It should be noted that, the up and down relationship as shown in the drawing is merely illustrative and does not limit the present disclosure.

In the curing method as shown in FIG. 3, a mask is provided over the curable material, an incident light is provided at the side of the mask to cure the curable material. The shielding layer of the mask aligns with the curable material and includes light conversion material. The light conversion material is configured to convert the incident light to an exiting light which is capable of cure the curable material.

In one embodiment, specifically, a sealing adhesive 306 including curable material is disposed near the display region 301, and a shielding layer containing upper conversion material 307 is disposed on the transparent substrate 303 of the mask. A visible light 304 as an incident light is emitted toward the mask from a light source 305. Part of the incident light passes through the shielding layer of the mask. Since this part of the incident light is influenced by the upper conversion material 307 of the shielding layer, this part of the incident light is converted to an ultraviolet light 302 which is capable of curing the sealing adhesive. The other part of the incident light does not have its wavelength changed and directly passes through the regions of the mask except for the shielding layer. Since the shielding layer containing the upper conversion material aligns with the sealing adhesive 306, the sealing adhesive 306 is influenced by the ultraviolet light exiting from the shielding layer and thus cured. Therefore, other parts corresponding to for example the crystal display region 301 do not need to be shielded, and the manufacture process can be simplified and the manufacture cost can be lowered.

The upper conversion material may include at least one of the following materials: $NaYF_4:Er^{3+}$, $Yb^{3+}$; $CaF_2(Er^{3+})$; $ZrO_2(Er^{3+})$; $Ca_3(PO_4)_2:Tm^{3+}$.

The shielding layer also includes an adhesive. The adhesive preferably includes thermal curing resin such as epoxy resin. In one embodiment, colloidal resin mixed with the upper conversion material may be coated on a transparent substrate, and the coated pattern corresponds to the pattern of the sealing adhesive on the glass substrate to be pre-cured.

After the incident light is provided at the mask side to complete the process of light curing, the curable material (for example, the sealing adhesive) may be further thermally cured.

Compared with the related art, the present disclosure only requires one substrate (for example, a transparent substrate). For different products, shielding layers (such as resin) with different patterns may be coated. An exiting light (such as an ultraviolet) is emitted through the shielding layer to cure the curable material (such as sealing adhesive). When change for manufacturing different products, it only needs to clean the shielding layer and coat with another shielding layer. It can eliminate the need for fabricating different masks (such as UV masks) for different products, can save substrates (such as glass substrates) and lower cost. Moreover, it can eliminate the need for storing and retrieving masks, can save production time.

Particular embodiments have been described, these embodiments are presented merely by way of example, and are not intended to limit the scope of the present disclosure. In fact, the novel embodiment described herein may be implemented in various other forms. In addition, various omissions, substitutions and alterations to the forms of embodiments described herein may be made without departing from the spirit of the present disclosure. The appended claims and their equivalents are intended to cover such forms or modifications as falling within the scope and spirit of the present disclosure.

What is claimed is:

1. A curing method, comprising providing a mask on curable material and providing an incident light on a side of the mask to cure the curable material, wherein
a shielding layer of the mask aligns with the curable material;
the shielding layer comprises light conversion material and an adhesive, wherein the adhesive comprises thermal curing resin; and
the light conversion material converts the incident light to an exiting light which cures the curable material.

2. The curing method of claim 1, wherein the light conversion material is upper conversion material.

3. The curing method of claim 2, wherein the upper conversion material converts a visible light to an ultraviolet light.

4. The curing method of claim 3, wherein the upper conversion material comprises at least one of the following materials: NaYF4:Er3+, Yb3+; CaF2(Er3+); ZrO2(Er3+); Ca3(PO4)2:Tm3+.

5. The curing method of claim 1, wherein the step of providing the mask comprises steps of:
providing a substrate;
mixing the adhesive and the light conversion light to form a mixture; and
coating the mixture on the substrate as a particular pattern to form the shielding layer.

6. The curing method of claim 1, wherein the curable material comprises a sealing adhesive.

7. The curing method of claim 6, wherein
the substrate comprises at least one of the following materials: glass, PMMA, PET and PC; and
the curing method further comprises after the incident light is provided at the side of the mask, thermally curing the sealing adhesive.

8. A manufacture method of a display panel, wherein the method comprises the curing method of claim 1.

9. A display panel, wherein the display panel is manufactured through the manufacture method of a display panel according to claim 8.

10. A mask, comprising a substrate and a shielding layer on the substrate, the shielding layer comprising light conversion material and an adhesive, wherein the adhesive comprises thermal curing resin, wherein the conversion material converts an incident light to an exiting light which cures curable material.

11. The mask of claim 10, wherein the light conversion material is upper conversion material.

12. The mask of claim 11, wherein the upper conversion material converts a visible light to an ultraviolet light.

13. The mask of claim 12, wherein the upper conversion material comprises at least one of the following materials: NaYF4:Er3+, Yb3+; CaF2(Er3+); ZrO2(Er3+); Ca3(PO4)2:Tm3+.

14. The mask of claim 10, wherein
the substrate comprises a transparent substrate; and
the curable material comprises a sealing adhesive.

15. The mask of claim 14, wherein
the substrate comprises at least one of the following materials: glass, PMMA, PET and PC.

* * * * *